(12) United States Patent
Liu

(10) Patent No.: US 6,706,548 B2
(45) Date of Patent: Mar. 16, 2004

(54) METHOD OF MAKING A MICROMECHANICAL DEVICE

(75) Inventor: Lianjun Liu, Gilbert, AZ (US)

(73) Assignee: Motorola, Inc., Schaumberg, IL (US)

( * ) Notice: Subject to any disclaimer, the term of this patent is extended or adjusted under 35 U.S.C. 154(b) by 17 days.

(21) Appl. No.: 10/041,337

(22) Filed: Jan. 8, 2002

(65) Prior Publication Data

US 2003/0129824 A1 Jul. 10, 2003

(51) Int. Cl.[7] .................. H01L 2/4763; H01L 21/00
(52) U.S. Cl. ............................... 438/52; 438/622
(58) Field of Search .................. 200/181, 245, 200/246; 333/262, 101, 105; 310/309; 438/623, 52, 50, 589, 637, 622, 638; 250/774, 775, 773

(56) References Cited

U.S. PATENT DOCUMENTS

| | | | |
|---|---|---|---|
| 5,527,741 A | * 6/1996 | Cole et al. | 438/107 |
| 5,578,976 A | 11/1996 | Yao | |
| 5,747,360 A | 5/1998 | Nulman | |
| 6,046,659 A | * 4/2000 | Loo et al. | 333/262 |
| 6,296,779 B1 | * 10/2001 | Clark et al. | 216/66 |
| 6,331,257 B1 | * 12/2001 | Loo et al. | 216/13 |
| 6,440,767 B1 | * 8/2002 | Loo et al. | 438/52 |
| 2002/0098613 A1 | * 7/2002 | Loo et al. | 438/73 |
| 2002/0171518 A1 | * 11/2002 | Hsu et al. | 335/78 |

OTHER PUBLICATIONS

Paul M. Zavracky et al., "Micromechanical Switches Fabricated Using Nickel Surface Micromachining", *Journal of Microelectromechanical Systems*, vol. 6, No. 1, Mar. 1997, 1057–7157/97, pp. 3–9.

Sumit Majumder et al., "Measurement and Modeling of Surface Micromachined, Electrostatically Actuated Microswitches", *TRANSDUCERS '97 International Conference on Solid–State Sensors and Actuators*, Chicago, Jun. 18–19, 1997, 0–7803–3829–4/97, pp. 1145–1148.

* cited by examiner

*Primary Examiner*—Carl Whitehead, Jr.
*Assistant Examiner*—William C Vesperman

(57) ABSTRACT

A method of making a micromechanical device including forming recesses (28) using two sacrificial layers (22 and 27). A first sacrificial layer (22) is formed over an input signal line (16) and an output signal line (17). A portion of the first sacrificial layer (22) is removed to form openings (26) over the input signal line (16) and the output signal line (17). A second sacrificial layer (27) is formed over the first sacrificial layer (22) and openings (26) to form recesses (28) over the openings (26). A conductive layer (32) is formed over the second sacrificial layer (27) and the recesses (28). The conductive layer (32) serves as a shorting bar of a cantilever beam structure that couples input signal line (16) to output signal line (17) during operation.

11 Claims, 3 Drawing Sheets

METHOD OF MAKING A MICROMECHANICAL DEVICE

BACKGROUND OF THE INVENTION

This invention relates, in general, to semiconductor devices, and more particularly, to a method of fabricating micromechanical devices.

Micromechanical devices are used for a wide range of applications. These devices or micro-switches have the advantage of providing superior switching characteristics over a wide range of frequencies. One type of micromechanical switch structure utilizes a cantilever beam design. A cantilever beam with contact metal thereon rests above an input signal line and an output signal line. During switch operation, the beam is electrostatically actuated by applying voltage to an electrode below the cantilever beam. Electrostatic force pulls the cantilever beam toward the input signal line and the output signal line, thus creating a conduction path between the input line and the output line through the metal contact on the cantilever beam.

In fabricating this type of micro-switch, manufacturing nonuniformity can result in poor metal step coverage of the contact metal. Poor metal step coverage results in micromechanical devices having decreased reliability and performance. If the step coverage is poor enough, voids in the contact metal can cause problems with the formation of the conduction path described above.

In view of the foregoing discussion, it would be advantageous to have a more manufacturable process for making electromechanical devices. Accordingly, there is a need for a micromechanical device with reliable mechanical and electrical contact characteristics.

DETAILED DESCRIPTION OF THE PREFERRED EMBODIMENTS

The present invention relates to structures and methods for forming a micromechanical device. More particularly, the present invention utilizes a two step process for forming a recess in which a metal contact of a cantilever beam is formed. The two step process results in, among other things, the formation of a metal contact having better step coverage and a smoother surface, which results in a micromechanical device having better reliability and electrical characteristics.

Figure 1:
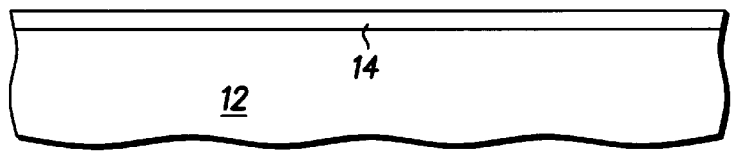
FIG. 1 illustrates a cross-sectional view of a device in a beginning stage of fabrication according to an embodiment of the present invention.

Turning now to the figures, FIG. 1 illustrates a cross-sectional view of a device 10 in a beginning stage of fabrication according to an embodiment of the present invention. First, a substrate 12 is provided which provides for structural or mechanical support. Preferably, substrate 12 is comprised of material that does not allow any Radio Frequency (RF) losses. Preferably, materials such as a high resistivity silicon, gallium arsenide (GaAs), or glass may comprise substrate 12 because these materials are compatible with semiconductor processes. Other materials may be suitable. High resistivity silicon having a resistivity from 100 Ω-cm to 10,000 Ω-cm is suitable.

Next, an isolation layer 14 is formed over substrate 12. Isolation layer 14 is preferably comprised of silicon dioxide, although other nonconductive materials may be used. Further, the optimum choice of this material is dependent on what comprises substrate 12. If silicon dioxide is used, a thickness of approximately 0.5 to 5 microns is suitable and may be formed by either thermal oxidation techniques or deposition, which are both well known in the semiconductor processing art. The formation of isolation layer 14 provides for further isolation between substrate 12 and conductive layers formed as described below.

Figure 2:
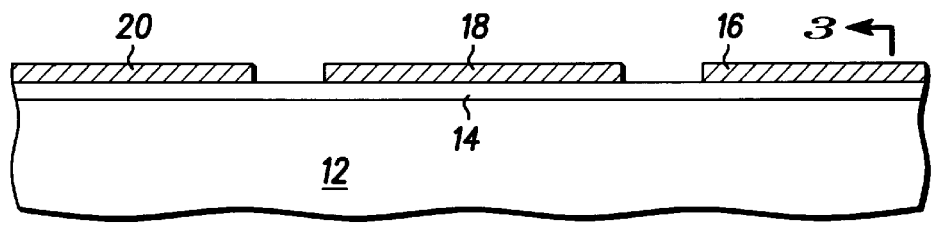
FIG. 2 illustrates a cross-sectional view of the device of FIG. 1 further along in processing.
Figure 3:
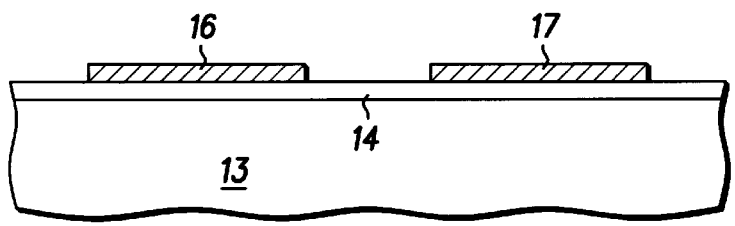
FIG. 3 illustrates a cross-sectional view taken along line 3—3 of the device shown in FIG. 2.

With reference to FIGS. 2 and 3, FIG. 2 illustrates a cross-sectional view of device 10 further along in processing. FIG. 3 illustrates a cross-sectional view of device 10 taken along line 3—3 at the same processing stage as FIG. 2. Input signal line 16, output signal line 17, ground contact 18, and top contact 20 are formed over isolation layer 14. Preferably, input signal line 16, output signal line 17, ground contact 18, and top contact 20 are formed of the same material(s) and at the same time. These contact layers or electrodes can be formed by lift off techniques or by first forming and then patterning a metal layer or metal layers over isolation layer 14. A lift-off process is preferred if metal materials used are difficult to pattern using etching techniques. Either method of forming these contact layers is well known in the art. Input signal line 16 is physically separated from output signal line 17.

Input signal line 16, output signal line 17, ground contact 18, and top contact 20 are preferably comprised of a conductive layer which is a non-oxidizing metal or metal layers, such as, for example, chrome and gold (with chrome being deposited first). If chrome and gold are used, a suitable thickness of chrome is 100–300 angstroms and of gold is 0.5–3 microns.

Figure 4:
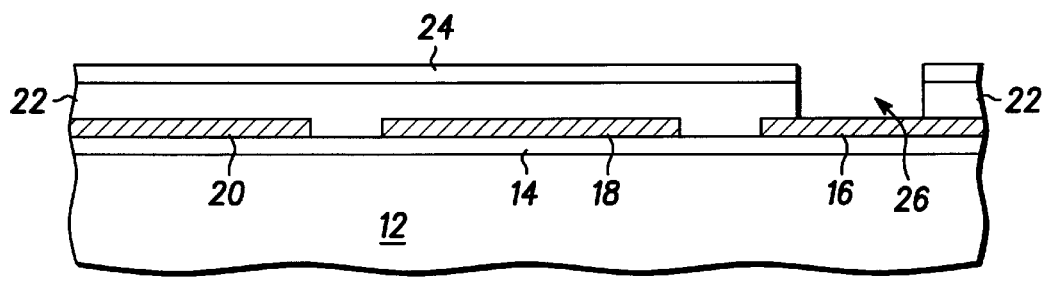
FIG. 4 illustrates a cross-sectional view of the device of FIG. 2 further along in processing.

FIG. 4 illustrates device 10 further along in processing. A first sacrificial layer 22 is formed over isolation layer 14 and input signal line 16, output signal line 17, and ground contact 18. First sacrificial layer 22 is preferably comprised of polyimide. The thickness of first sacrificial layer 22 is preferably in the range of 0.5–2 microns, but should be at least the height of a recess step to be described hereinafter.

First sacrificial layer 22 is coated on the surface of device 10 and then heated. Preferably, first sacrificial layer 22 is partially cured in order to reduce processing time. Fully curing first sacrificial layer 22 is not required at this time, because further heat cycles will cure it. That a polyimide layer is fully cured means that the polyimide is fully imidized. The following table shows a suitable partial cure process for first sacrificial layer 22.

| Process | Temperature (° C.) | Time (min) |
| --- | --- | --- |
| Ramp | 140–150 | 30 |
| Ramp and cure | 250 | 30 |
| Cool down | 140–150 | 30 |
| Cool down | room temperature | — |

It should be noted that other times and temperatures may provide desired results.

Subsequently, first and second openings 26 are formed in first sacrificial layer 22 over input signal line 16 (shown in FIG. 4) and output signal line 17 (not shown in FIG. 4, see FIG. 7). Openings 26 are formed by first providing a masking layer 24 over first sacrificial layer 22 and then patterning masking layer 24 to provide openings 26 in masking layer 24. Masking layer 24 can be comprised of a resist layer or a hardmask layer such as silicon dioxide ($SiO_2$). A portion of sacrificial layer 22 is then etched so that openings 26 extend down to input signal line 16 (shown in FIG. 4) and output signal line 17 (not shown in FIG. 4, see FIG. 7). An oxygen ($O_2$) plasma is preferably used to dry etch first sacrificial layer 22 to form openings 26 therein.

Figure 5:
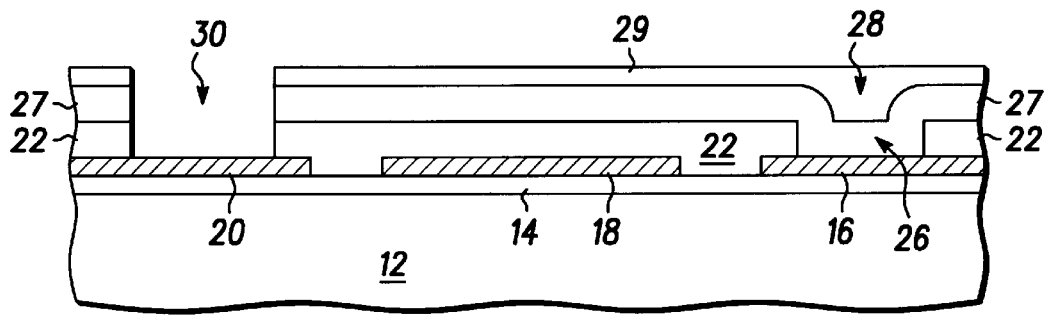
FIG. 5 illustrates a cross-sectional view of the device of FIG. 4 further along in processing.
Figure 7:
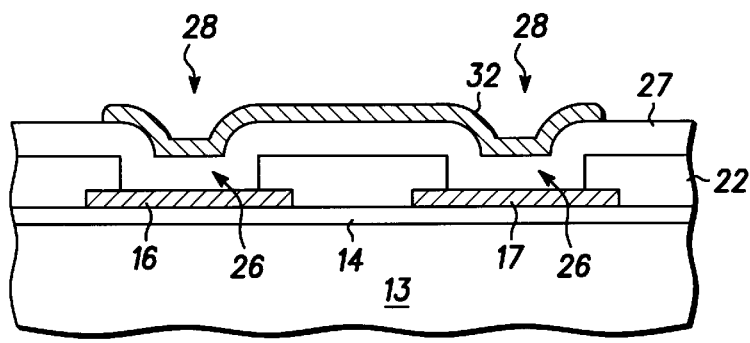
FIG. 7 illustrates a cross-sectional view taken along line 7—7 of the device shown in FIG. 6.

FIG. 5 illustrates device 10 of FIG. 4 where masking layer 24 has been removed and a second sacrificial layer 27 is formed over first sacrificial layer 22, including in openings 26 over input signal line 16 (and output signal line 17, shown in FIG. 7). Second sacrificial layer 27 is preferably comprised of polyimide. The thickness of second sacrificial layer 27 in this embodiment is in the range of 1–3 microns. Preferably, second sacrificial layer 27 should be at least thin enough so that first and second recesses 28 are formed covering openings 26 (second recess 28 is shown in FIG. 7).

Second sacrificial layer 27 is coated on the surface of device 10 and then heated. In this case it is desirable to fully cure second sacrificial layer 27 (which will fully cure first sacrificial layer 22 as well) at a temperature above 250° C. For example, this cure process can be like the heating process of first sacrificial layer 22, except that the temperature is ramped to approximately 350° C. for a ramp and cure time of approximately 30 minutes.

This two step process of forming first sacrificial layer 22 and second sacrificial layer 27 allows for the formation of recesses 28 which do not have steep sidewalls. In addition, because an etch step is not performed to form recesses 28, the surface of second sacrificial layer 27 in the area of recesses 28 is smooth and the sidewalls have a rounded profile. Further, the depth or height of recesses 28 can be more readily controlled (by controlling the thickness of first sacrificial layer 22 and second sacrificial layer 27), than if a dry etch is performed in a single sacrificial layer where etching would have to terminate within the sacrificial layer.

Still with reference to FIG. 5, an opening or anchor recess 30 is formed in second sacrificial layer 27 and first sacrificial layer 22 over top contact 20. First, a masking layer 29 is formed over sacrificial layer 27 and then patterned to provide an opening 30. Opening 30 can be formed by using a photolithography and etch process which is well known in the semiconductor fabrication art. Masking layer 29 can be comprised of a resist layer or a hardmask layer such as $SiO_2$. Second sacrificial layer 27 and first sacrificial layer 22 are then preferably dry etched so that opening 30 extends to top contact 20. The method discussed above for forming opening 26 may be used here as well.

Figure 6:
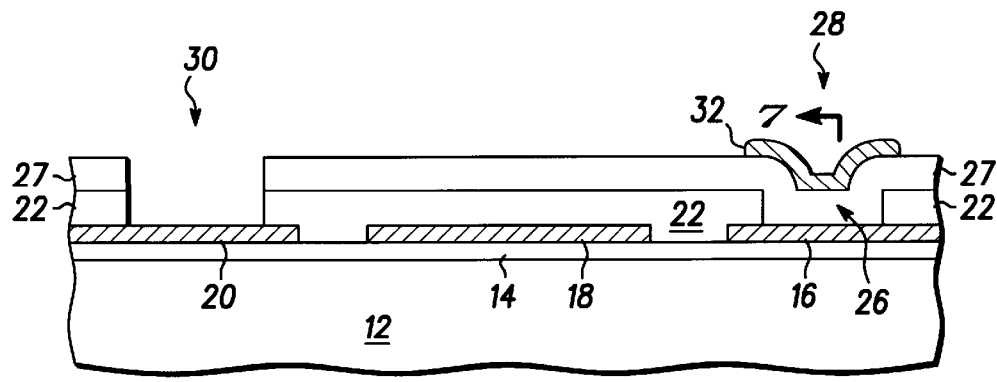
FIG. 6 illustrates a cross-sectional view of the device of FIG. 5 further along in processing.

Now with reference to FIGS. 6 and 7, FIG. 6 illustrates device 10 of FIG. 5 further along in processing. FIG. 7 illustrates the structure of FIG. 6 taken along line 7—7. Masking layer 29 is removed. A contact or shorting bar 32 is formed over input signal line 16 and output signal line 17 over recesses 28 of second sacrificial layer 27. In FIG. 7, one can see that shorting bar 32 bridges over input signal line 16 and output signal line 17. Shorting bar 32 is preferably formed using lift-off techniques. Lift-off techniques are well known in the art and thus this step is not described further.

Shorting bar 32 should be comprised of a conductive layer or metal that is compatible with input signal line 16 and output signal line 17. In a preferred embodiment, shorting bar 32 is comprised of a layer of gold and a layer of chrome. Gold is formed first so that it is in contact with the gold of input signal line 16 and output signal line 17 when closed during switch operation. A suitable amount of gold is 4000–20,000 angstroms and a suitable amount of chrome is 150–250 angstroms, however, other thicknesses may be suitable.

Figure 8:
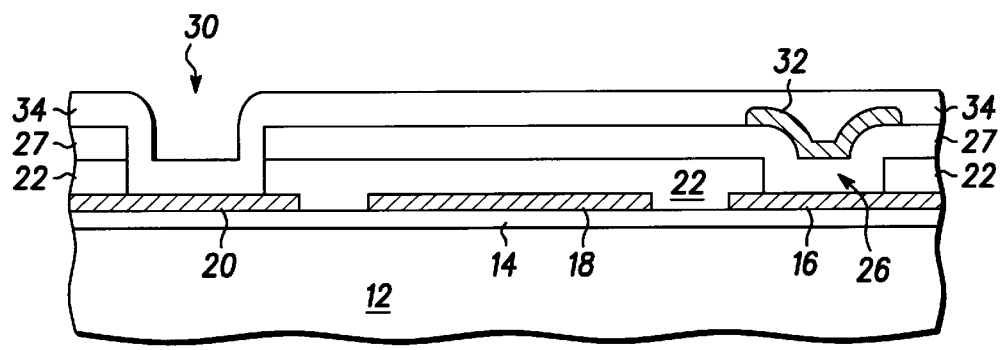
FIG. 8 illustrates a cross-sectional view of the device of FIG. 6 further along in processing.

FIG. 8 illustrates a cross-sectional view of device 10 further along in processing. A dielectric layer 34 is formed over second sacrificial layer 27, over shorting bar 32, and in opening 30. Dielectric layer 34 is preferably comprised of silicon dioxide, silicon oxynitride or silicon nitride, but other dielectrics may be used as well, including a composite layer of different dielectrics. The thickness of dielectric layer 34 is in the range of 1–3 microns and preferably formed by Pressure Enhanced Chemical Vapor Deposition (PECVD) to produce a low stress dielectric layer.

Figure 9:
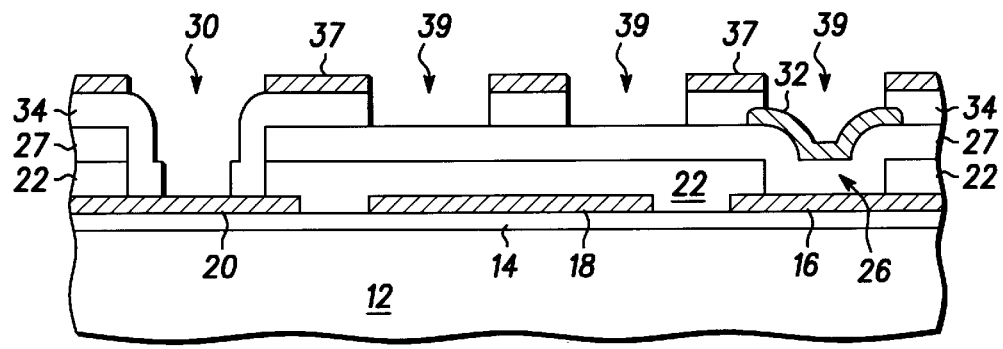
FIG. 9 illustrates a cross-sectional view of the device of FIG. 8 further along in processing.

FIG. 9 illustrates a cross-sectional view of device 10 further along in processing. A top electrode 37 is formed over dielectric layer 34. Top electrode 37 is preferably comprised of titanium and gold. For example, 150–250 angstroms of titanium and 1000–3000 angstroms of gold may be formed. Top electrode 37 having openings 39 formed therein is preferably formed by using photoresist lift-off techniques.

Subsequently, the cantilever structure is defined and openings 39 in dielectric layer 34 are formed using conventional photolithography and etch processes to remove portions of dielectric layer 34. Openings 39 in dielectric 34 are formed in order to enable the subsequent removal of first sacrificial layer 22 and second sacrificial layer 27 to release the cantilever structure comprised of dielectric layer 34, shorting bar 32, and top electrode 37 in a reasonable amount of time. The cantilever structure will be more readily seen with reference to FIG. 11. A portion of dielectric layer 34 is also removed over top contact 20 to have opening 30 extend to top contact 20.

Figure 10:
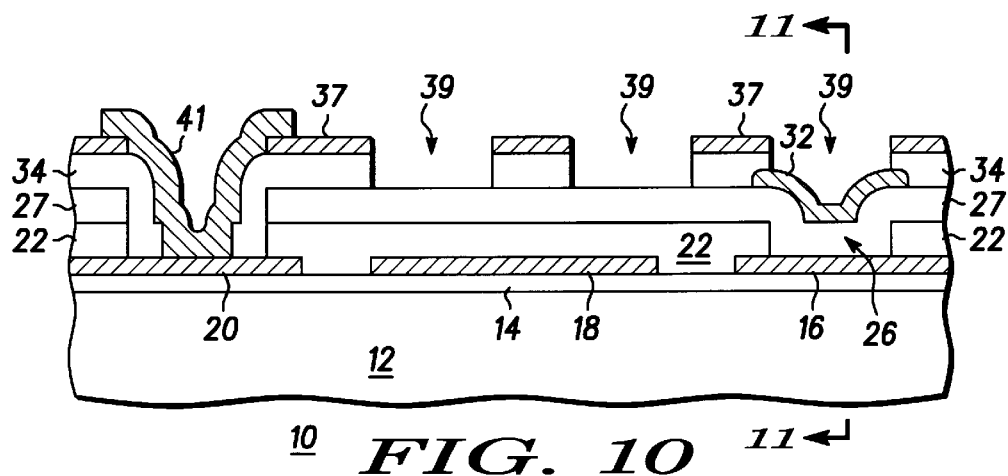
FIG. 10 illustrates a cross-sectional view of the device of FIG. 9 further along in processing.

FIG. 10 illustrates a cross-sectional view of device 10 further along in processing. A pad metal 41 is formed to electrically couple top contact 20 and top electrode 37. Pad metal 41 is preferably formed by using lift-off techniques. Pad metal is comprised of a conductive material and is preferably comprised of 100 to 300 angstroms of chrome and 1000 to 10,000 angstroms of gold. Pad metal 41 and top contact 20 provide the anchor of the cantilever beam structure to substrate 12.

Figure 11:
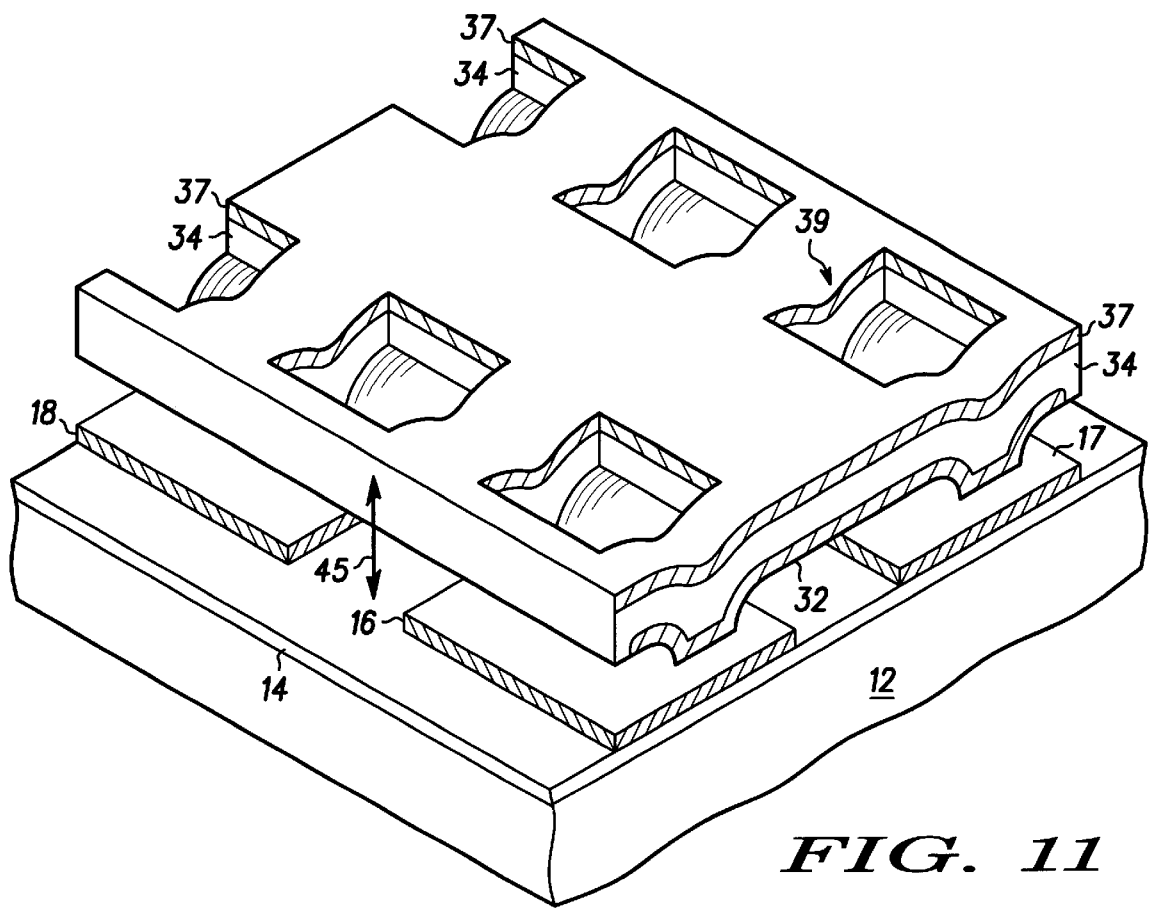
FIG. 11 illustrates a perspective view taken along line 11—11 of a portion of the device of FIG. 10 further along in processing.

FIG. 11 illustrates a perspective view of a portion of device 10 taken along line 11—11 of FIG. 10, which has been subjected to further processing. In this step, first sacrificial layer 22 and second sacrificial layer 27 are removed. This process releases the cantilever structure comprised of dielectric layer 34, shorting bar 32 and top electrode 37 so that it is able to move in the direction shown by arrow 45. Preferably, first sacrificial layer 22 and second sacrificial layer 27 are removed by using an oxygen plasma dry etch.

The view shown in FIG. 11 clearly illustrates how shorting bar 32 is fabricated to couple input signal line 16 and output signal line 17 when an electrostatic charge between top electrode 27 and ground 18 pulls the cantilever structure toward ground layer 18. The electrostatic charge is formed when a voltage is applied between top electrode 27 and ground contact 18.

The present invention allows for the formation of a shorting bar 32 wherein the area that makes contact with input signal line 16 and output signal line 17 is smooth, thus enhancing the electrical contact. In addition, the use of first sacrificial layer 22 and second sacrificial layer 27 allows shorting bar 32 to have better step coverage, so that no voids or nonuniform areas are formed. Better step coverage means that device 10 is more manufacturable. Furthermore, device 10 has better electrical characteristics and reliability as a result of the improved step coverage of shorting bar 32. The improved step coverage is a result of using sacrificial layers 22 and 27, where an opening 26 is formed in the first sacrificial layer 22 and then the second sacrificial 27 layer is formed in the opening 26 to provide a recess 28 having smooth, rounded edges.

By now it should be appreciated that structures and methods have been provided for improving the manufacturability of micromechanical devices as well as for providing a micromechanical device having improved electrical characteristics and better reliability. In particular, the aforementioned advantages are obtained by utilizing two sacrificial layers (22 and 27) wherein the second sacrificial layer 27 is not etched to form a recess 28. The recess 28 that is formed thus lacks steep sidewalls and rough areas so that a shorting bar 32 deposited over the recess 28 had improved step coverage and a smooth surface.

Thus, a process for fabricating a micromechanical device, which fully meets the advantages set forth above, has been provided. Although the invention has been described and illustrated with reference to specific illustrative embodiments, it is not intended that the invention be limited to those illustrative embodiments. Those skilled in the art will recognize that variations and modifications can be made without departing from the spirit of the invention. Therefore, all such variations and modifications as fall within the scope of the appended claims and equivalents thereof are intended to be included within the invention.

What is claimed is:

1. A method of making a microelectronic device comprising the steps of:

providing a substrate;

forming an input signal line over the substrate;

forming an output signal line over the substrate and spaced apart from the input signal line;

forming a first sacrificial layer over the input signal line and the output signal line;

removing a portion of the first sacrificial layer over the input signal line to form a first opening and over the output signal line to form a second opening;

forming a second sacrificial layer over the first sacrificial layer, the first opening, and the second opening, wherein a first recess and a second recess are formed over the first opening and the second opening; and forming a conductive layer over a portion of the second sacrificial layer, the first recess, and the second recess, wherein the step of forming the second sacrificial layer comprises forming a second polyimide layer.

2. The method of claim 1, wherein the step of forming the first sacrificial layer comprises forming a first polyimide layer.

3. The method of claim 2, further comprising the step of heating the first sacrificial layer at a temperature below or equal to approximately 250° C. so that the first sacrificial layer is only partially cured.

4. The method of claim 1, further comprising the step of heating the second sacrificial layer at a temperature above 250° C. so that the second sacrificial layer is substantially fully cured.

5. The method of claim 1, wherein the step of forming the first sacrificial layer comprises forming the first sacrificial layer having a thickness of approximately 0.5 to 2 microns.

6. The method of claim 1, wherein the step of removing a portion of the first sacrificial layer comprises:

forming a photoresist layer over the first sacrificial layer, patterning the photoresist layer to use as a mask to form the first opening and the second opening, removing the photoresist layer prior to the step of forming the second sacrificial layer.

7. The method of claim 1, wherein the step of removing a portion of the first sacrificial layer comprising using a dry etch.

8. The method of claim 1, wherein the step of forming the second sacrificial layer comprises the first recess and the second recess being formed in absence of an etch step.

9. A method of making a microelectronic device comprising the steps of:

providing a substrate;

forming an input signal line over the substrate;

forming an output signal line over the substrate and spaced apart from the input signal line;

forming a first sacrificial layer over the input signal line and the output signal line;

removing a portion of the first sacrificial layer over the input signal line to form a first opening and over the output signal line to form a second opening;

forming a second sacrificial layer over the first sacrificial layer, the first opening, and the second opening, wherein a first recess and a second recess are formed over the first opening and the second opening; and forming a conductive layer over a portion of the second sacrificial layer, the first recess, and the second recess, further comprising the steps of:

forming a dielectric layer over the second sacrificial layer and the conductive layer; and removing the first sacrificial layer and the second sacrificial layer to form a cantilever beam structure comprised of the conductive layer and the dielectric layer above the input signal line and the output signal line.

10. A method of making a microelectronic device comprising the steps of:

providing a substrate;

forming an input signal line and an output signal line over the substrate;

forming a first sacrificial layer over the substrate, the input signal line and the output signal line;

heating the first sacrificial layer;

dry etching a portion of the first sacrificial layer over the input signal line to form a first opening and over the output signal line to form a second opening;

forming a second sacrificial layer over the first sacrificial layer, the first opening, and the second opening to form a fist recess over the first opening and a second recess over the second opening, whereby the first recess and the second recess have rounded edges; and heating the second sacrificial layer;

forming a conductive layer over the second sacrificial layer, the first recess, and the second recess;

forming a dielectric layer over the conductive layer and the second sacrificial layer;

removing the first and the second sacrificial layers to create a cantilever beam comprised of the dielectric layer and the conductive layer.

11. The method of claim 10, wherein the step of forming the first sacrificial layer comprises forming a first polyimide layer and the step of forming the second sacrificial layer comprises forming a second polyimide layer.

* * * * *

UNITED STATES PATENT AND TRADEMARK OFFICE
CERTIFICATE OF CORRECTION

PATENT NO.   : 6,706,548 B2
DATED        : March 16, 2004
INVENTOR(S)  : Liu

It is certified that error appears in the above-identified patent and that said Letters Patent is hereby corrected as shown below:

<u>Column 6,</u>
Line 65, change "a fist recess" to -- a first recess --

Signed and Sealed this

Sixth Day of July, 2004

JON W. DUDAS
*Acting Director of the United States Patent and Trademark Office*